(12) United States Patent  (10) Patent No.: US 9,120,173 B2
Routledge  (45) Date of Patent: Sep. 1, 2015

(54) BONDING OF METAL COMPONENTS

(75) Inventor: David P. Routledge, Derby (GB)

(73) Assignee: ROLLS-ROYCE PLC, London (GB)

( * ) Notice: Subject to any disclaimer, the term of this patent is extended or adjusted under 35 U.S.C. 154(b) by 371 days.

(21) Appl. No.: 13/546,487

(22) Filed: Jul. 11, 2012

(65) Prior Publication Data

US 2013/0019996 A1 Jan. 24, 2013

(30) Foreign Application Priority Data

Jul. 19, 2011 (GB) .................................. 1112376.7

(51) Int. Cl.
| | |
|---|---|
| B23K 35/00 | (2006.01) |
| B23K 35/02 | (2006.01) |
| B23K 31/00 | (2006.01) |
| B23K 1/19 | (2006.01) |
| B23K 20/16 | (2006.01) |
| H01L 23/00 | (2006.01) |
| B23K 20/02 | (2006.01) |
| B23K 1/00 | (2006.01) |
| B23K 1/20 | (2006.01) |
| B23K 35/30 | (2006.01) |

(52) U.S. Cl.
CPC ................. *B23K 1/19* (2013.01); *B23K 1/0004* (2013.01); *B23K 1/206* (2013.01); *B23K 20/023* (2013.01); *B23K 20/16* (2013.01); *B23K 35/02* (2013.01); *B23K 35/0238* (2013.01); *B23K 35/3006* (2013.01); *H01L 24/83* (2013.01); *B23K 2203/14* (2013.01); *B23K 2203/18* (2013.01)

(58) Field of Classification Search
USPC .......... 228/245, 246, 252, 253, 254, 256, 261
See application file for complete search history.

(56) References Cited

U.S. PATENT DOCUMENTS

| 2,757,269 | A | * | 7/1956 | Hanink et al. ............. 219/85.15 |
|---|---|---|---|---|
| 2,798,843 | A | | 7/1957 | Slomin et al. |
| 3,981,429 | A | | 9/1976 | Parker |
| 4,029,479 | A | | 6/1977 | Parker |
| 4,674,675 | A | | 6/1987 | Mietrach |
| 4,725,509 | A | | 2/1988 | Ryan |
| 5,102,031 | A | * | 4/1992 | Heitman et al. ............. 228/175 |

(Continued)

FOREIGN PATENT DOCUMENTS

| CN | 101284323 A | 10/2008 |
|---|---|---|
| GB | 1 438 842 | 6/1976 |
| GB | 1 478 890 | 7/1977 |

OTHER PUBLICATIONS

NiDI; Welding of Stainless Steels and Other Joining Methods; 1988.*

(Continued)

*Primary Examiner* — Erin Saad
(74) *Attorney, Agent, or Firm* — Oliff PLC

(57) ABSTRACT

A method of bonding a first component (10) comprising a titanium-containing alloy to a second metal component (12), wherein a coating layer (14,16) is applied to each of the first and second components in the region to be bonded. The coating layers (14,16) comprise a precious metal. An intermediate metallic layer (18) is interposed between the coating layer (14) of the first component and the coating layer (16) of the second component. The respective coating layers are held in contact with the intermediate layer (18) and the coating layers and the intermediate layer are heated to initiate melting of at least one of said layers so as to form a bond between the first and second components by brazing.

18 Claims, 2 Drawing Sheets

(56) References Cited

U.S. PATENT DOCUMENTS

| | | | |
|---|---|---|---|
| 5,372,298 A | | 12/1994 | Glaeser |
| 5,961,853 A | | 10/1999 | Thornton |
| 6,019,736 A | * | 2/2000 | Avellanet et al. ............. 600/585 |
| 2007/0119907 A1 | | 5/2007 | Rödhammer |
| 2010/0124669 A1 | * | 5/2010 | Lee et al. ...................... 428/660 |

OTHER PUBLICATIONS

Xue et al., "Analysis on microstructure of resistance-brazed joint of TiNi shape memory alloy," Hanjie Xuebao, *Transactions of the China Welding Institution*, vol. 25, No. 1, Feb. 1, 2004, pp. 1-4, (with Abstract).

Nov. 20, 2012 European Search Report issued in European Patent Application No. EP 12 17 5957.

Aug. 22, 2011 Search Report issued in British Patent Application No. GB1112376.7.

Feb. 9, 2015 Search Report issued in European Patent Application No. 12 175 957.5.

Ren-Haur Shiue et al.; Infrared Brazing Ti 50 Ni 50 and Ti-6Al-4V Using the BAg-8 Braze Alloy; Materials Transactions vol. 46, No. 9, Sep. 15, 2005; pp. 2057-2066.

Shiue R H et al.; Infrared brazing of Ti50Ni50 shape memeory alloy using two Ag-Cu-Ti active braze alloys; Intermatallics, Elsevier Science Publishers B.V, GB, vol. 14, No. 6, Jan. 4, 2006; pp. 630-638.

* cited by examiner

BONDING OF METAL COMPONENTS

The present invention relates to methods of bonding metal or metal alloy components and more particularly to bonding methods involving brazing.

A conventional brazing process typically involves the heating of two metal components with a third metallic material, typically a brazing alloy, of lower melting point, disposed there-between such that the third metal melts and reacts with the parent materials to form a strong bond. This differs from soldering in that the interaction between the brazing alloy and the parent materials is greater than that in soldering, at least in part because the temperatures involved in brazing processes are higher.

In a number of industries, including the aerospace industry, it is necessary to form strong bonds between metallic materials, such as titanium alloys. U.S. Pat. No. 2,798,843 describes a method of plating a titanium alloy with silver and then using the silver layer to braze the titanium alloy.

Shape memory alloys (SMA's) are being increasingly investigated as actuators for a number of machines and applications. SMA's are intermetallic materials that exhibit a reversible martensitic transformation. In their high temperature (austenitic) state, the shape memory alloy behaves substantially like an ordinary metal. When the SMA cools down below a certain point (a martensite start temperature), the material transforms from a cubic structure to a monoclinic structure. Cycling the SMA between its martensitic and austenitic states by heating and cooling provides for a predictable actuator motion.

In order to allow SMA's, such as Nickel Titanium alloys, to be used in a variety of engineering applications, it is necessary to join the SMA to other metal materials.

Research has suggested that it may be possible to join a SMA to certain metal components through brazing using a commercially available silver-copper eutectic brazing alloy. However such methods require the whole component to be placed in a vacuum furnace at temperatures typically above 800° C. for an extended period of time, such as for example from three minutes to half an hour, depending on the heating method (infrared, microwaves, conventional oven, etc).

Shape memory alloys have been found to be particularly sensitive to heat treatment to temperatures suitable for titanium bonding and a major drawback of the above-described approach for SMA brazing, is that for actuator applications (as well as other potential SMA applications) the heat required for brazing can destroy, or at least negatively impact upon, the delicate shape memory effect (SME) properties of the SMA.

Whilst a combination of isothermal melting behaviour and relatively low alloy melting point makes eutectic alloys a widely-adopted choice for brazing applications, the inventor has also determined that the proposed brazing alloy promotes the formation of brittle copper-titanium intermetallic compounds during the brazing process that can reduce the strength of the joint and also adversely affect its fatigue life.

It is an object of the invention to provide an alternative method of bonding metal alloys and a corresponding bond, which mitigates at least some of the above problems. It is an additional or alternative aim of the invention to provide an SMA bonding process which creates an adequate bond without adversely affecting the operational attributes of the SMA.

The present invention derives from the basic premise of, interposing a plurality of metallic layers between metallic components to be bonded and heating the plurality of interposed layers to a temperature such that at least one of the layers only partially melts so as to form a brazing alloy and thereby bond the components together.

The interposing of layers between the metal components may comprise applying a coating layer to at least one of the metal components to be bonded. The coating layer may comprise or substantially consist of a precious metal, such as, for example, silver.

According to one aspect of the invention, there is provided a method of bonding a first component comprising a titanium-containing alloy to a second metal component containing nickel, the method comprising: applying a coating layer to the first component in the region to be bonded, the coating layer comprising or consisting of a precious metal; interposing an intermediate metallic layer between the coating layer of the first component and the second component; holding the coating layer in contact with the intermediate layer; and heating the coating layer and the intermediate layer to initiate melting of at least one of said layers so as to form a bond between the first and second components.

According to a preferred embodiment, the heating of the coating and intermediate layers is such that at least one of the coating and intermediate layers only partially melts. A portion of at least one layer may remain substantially solid throughout the bonding process.

A coating layer may be additionally or alternatively applied to the second component. The coating layer on the second component may comprise or substantially consist of a precious metal. The intermediate layer is preferably sandwiched between the coating layers of the first and second components during the onset of heating.

The brazing of the coating layer(s) with the intermediate layer according to the present invention has been found to reduce the formation of brittle intermetallic compounds during bonding. The intermediate layer may serve to prevent interdiffusion of the component materials during brazing.

The intermediate layer may serve to reduce the temperature at which the onset of melting of the coating layer occurs. The intermediate layer may serve as melting point depressant for the layered arrangement. The material or element of the intermediate layer may have a melting point higher than that of one or both coating layers.

According to one embodiment embodiment, the heating of the coating layer(s) and intermediate layer forms a brazing alloy in situ. The alloy typically comprises a combination of the coating layer(s) and intermediate layer materials.

In one embodiment, the heating may comprise heating the coating and/or intermediate layers to form a brazing alloy in situ such that the brazing alloy only partially melts. The method allows the melting of the metal coating layers to be controlled such that the formation of titanium intermetallics is minimised. The heating may comprise heating to, or beyond, a temperature at which the material of the first and/or second components is self fluxing.

According to a preferred embodiment, the heating of the layers comprises local heating of one or more of said layers. The heating may be achieved through resistance heating. An electric current may be passed through one or more of the first or second components or the layers there-between so as to generate heat therein. The bonding method may comprise a resistance brazing process.

The coating layer may be applied to the first and/or second components by a deposition process such as an electro-deposition process. The coating layer may be applied by electroplating.

The intermediate layer may be applied to an outer surface of the coating layer of at least one of the components. The intermediate layer may be applied by a deposition process such as an electro-deposition process. The intermediate layer may be applied by electroplating.

Electroplating of interlayers is beneficial since it reduces oxidation and other contaminants on the parent material surfaces.

The second component may comprise a titanium alloy. The first or second component may comprise a shape memory material, such as a shape memory alloy. The first or second material may comprise a Nickel Titanium alloy.

The local heating of the layers for brazing of the components is particularly beneficial when one of the components comprises a SMA, since the SMA can be maintained at a temperature substantially below the brazing temperature such that the shape memory properties of the SMA are not destroyed or adversely affected by the brazing process. That is to say the SMA behaviour remains substantially unchanged by the heat applied during the brazing process.

The coating layer on the first and/or second component may comprise silver. The intermediate layer may comprise copper.

It has been found that a strong metallurgical bond is formed by electroplating silver onto each of the components, electroplating a thin layer of copper onto one of the silver layers and then resistively heating the surfaces together. The electroplating of the silver to the components in advance of the brazing process has been found to increase bond strength. Also it has been found that, in using such a layered construction at the joint, and applying heat in the manner described, a semi-solid alloy composition is formed in situ which rapidly interacts with the first and second components, thereby reducing process times.

The present invention may also offer a greater degree of control of brazing alloy thickness and/or composition than compared to standard brazing alloys. Furthermore the brazing temperature can be adjusted by controlling the composition of the layers, which can provide a further advantage over the use of standard brazing alloys.

According to a further aspect of the present invention, there is provided a bond between first and second components produced according to the method of the first aspect.

Practicable embodiments of the invention are described below in further detail with reference to the following drawings, of which:

FIG. 1b shows the bond formed by brazing the material layer construction of FIG. 1a;

To construct a Shape Memory Alloy (SMA) actuator, for use in engineering applications, it would be beneficial to join a SMA, based on Ni-50 Ti-50 alloys, to other metals. For aerospace applications in particular, it would be beneficial if a SMA could be bonded to an aerospace grade titanium alloy, such as Ti-6Al-4V. Such grades of titanium and higher are also required in other industries such as medical, marine, chemical processing industries and accordingly the present invention may be equally applicable in such applications.

Research by the applicant into brazing titanium-containing components, involving the local heating of a silver-copper eutectic alloy, has revealed the formation of a titanium rich liquid in addition to the silver-copper liquid. It has been determined that this titanium liquid acts to eject the silver liquid such that the titanium liquid then bridges the gap between the components being bonded. In the example of bonding NiTi(Cu) and Ti-6Al-4V, bridging by the titanium liquid creates a self-sustaining reaction where titanium is dissolved from the Ti6-Al-4V and nickel plus titanium is dissolved from the NiTi(Cu) forming a $NiTi_2$ intermetallic compound.

This $NiTi_2$ material has very low strength, which makes the resulting bond unsuitable for a majority of applications.

This interaction has not been reported in the previous brazing experiments using vacuum furnaces since the pressure applied in such circumstances is not generally sufficient to allow the titanium-rich liquid to bridge the gap between the component or parent materials. The reactivity of titanium generally requires a titanium joint to be held in an inert atmosphere (such as a vacuum or very high purity argon) for brazing, since the presence of oxygen can weaken the joint. However such a process is relatively inefficient in both time and cost/energy.

The present invention derives from the basic premise of the provision of a means for preventing the titanium-rich liquid from bridging the gap between the components to be joined, which in this example comprise SMA and titanium alloy parent materials.

Figure 1A:
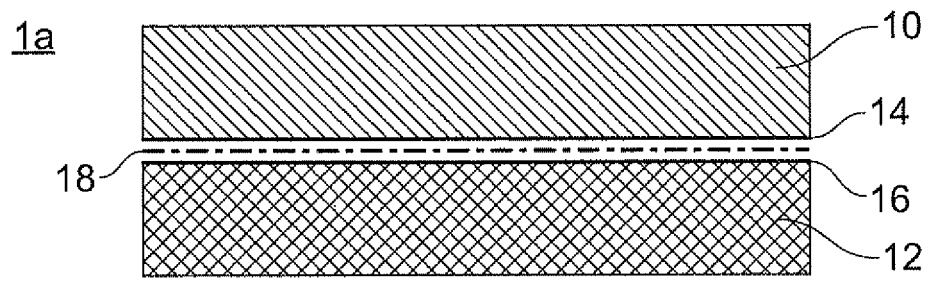
FIG. 1a shows a section view of material layers for bonding first and second components according to one embodiment of the invention.

Turning now to FIG. 1a, there is shown an arrangement of a first component 10 comprising, or consisting of, a first material and a second component 12 comprising, or consisting of, a second material. The first material is Ti-6Al-4V and the second component 12 is a NiTi SMA.

Each of the first and second components have a corresponding silver layer 14, 16 deposited thereon in the region of the intended join between the components. A further layer 18 is provided between the layers 14, 16 in readiness for brazing. The arrangement is then brazed in order to achieve the join shown in FIG. 1b. Details of the process are described in further detail below with reference to FIG. 2.

The first material 10 is prepared by cleaning the interface or surface to be bonded at stage 20. Conventional cleaning methods can be used to achieve a surface that is generally flat, smooth and free of grease or impurities.

At 22, the first material 10 is electrolytically or otherwise treated so that the surface oxide layer is soluble in a silver containing electrolyte (or other precious metal containing electrolyte, corresponding to the first material). Material 10 then has a thin layer 14 of silver (or other precious metal) electrolytically deposited on the surface to give a complete covering of the surface region to be bonded. The layer 14 is typically of the order of a few microns, for example approximately 10 microns. However greater layer thicknesses may be applied depending on the desired join characteristics.

The process of stages 20 and 22 is also carried out for material 12 at stages 24 and 26. This may be done concurrently or sequentially with stages 20 and 22. Thus both materials 10 and 12 have a corresponding layer 12, 14 of silver applied thereto in the region to be bonded. The layers 12 and 14 are substantially continuous and uniform, as far as possible using the relevant coating processes, over the region to be joined.

At 28, one of the surface layers 14, 16 after being deposited on the corresponding component 10, 12, is then coated with a melting point depressant material layer 18. This is achieved in this example by a further electro-deposition/electroplating process using copper sulphate/sulphuric acid solution to deposit a thin copper layer on the material immersed therein.

The volume of copper deposited is sufficient to initiate melting in the silver layers 12, 14 at a temperature below the melting point of silver, but there is insufficient copper to fully melt through the silver on either side of the joint.

The exposed outer layer surfaces of components 10 and 12, comprising one silver surface layer and one copper surface layer in this example, are then held together under a suitable force at stage 30. For the present embodiment, a pressure in the region of magnitude of 1 MPa has been found to be suitable, although it is envisaged that different forces/pressures will be applicable to different layer thicknesses and materials. Such layer thicknesses and associated forces can be determined by routine experimentation in order to achieve the desired effects described herein.

Figure 3:
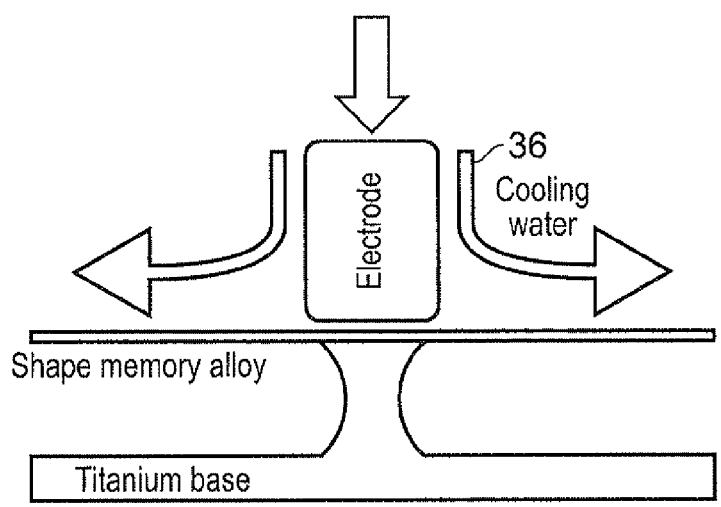
FIG. 3 shows a resistance brazing arrangement for use according to one embodiment of the invention; and, FIG. 4 shows a silver-copper phase diagram.

The contact region between the components is then rapidly heated at stage 32 until melting of between 50-70% of the layers forming the brazing alloy is achieved. In this embodiment the layer construction is heated to approximately 90% of the melting point of the material of layers 14 and 16, that is to a temperature of approximately 860° C. in the case of silver-copper bonding. Any suitable conventional rapid heating techniques may potentially be applied but in the present example resistance heating was undertaken using the arrangement shown in FIG. 3.

An electrode 34 is applied, in this example to the SMA side of the bond, so as to pass current through the assembly including the coating and intermediate layers and thereby heat the joining layers 14, 16 and 18 by electrical resistance. A cooling water supply 36 is provided to at least the SMA 12 to maintain the body of the SMA at a reduced temperature compared to that of the join. Typically the body temperature of the SMA material can be maintained at below 200° C. to avoid degradation to the SMA properties.

Despite only a single electrode 34 being shown, the intended heating method involves clamping the materials to be bonded between two water cooled electrodes so that the heat is generated at the interfaces within the joint and between the electrodes and the work piece. This method allows the shape memory alloy in the primary application to be cooled in the areas not being joined, through the water flowing around the electrodes.

The heating is maintained so as to hold the desired temperature in the vicinity of the join for in the region of 1 to 2 minutes. A duration of 90 seconds at the brazing temperature was found to be adequate.

The triple layer of the electrodeposited brazing alloy materials melts from the middle region (i.e. adjacent the intermediate layer 18) outwards. The bonding of the solid silver layer that is directly in contact with the parent materials is enhanced by the fact that the silver is already bonded to the parent material surface, instead of merely being placed in contact with the parent material, as is the case with conventional brazing alloys and processes.

Silver-copper brazing alloys can be used to better effect according to the present invention than according to conventional brazing processes. This can be achieved by having a solid or partially solid interlayer 18 separating the two sides during brazing. Solid state bonding using pure silver can create bonds between SMA and Ti-6Al-4V, but the brazing temperature and duration to form an effective bond would use significant power and cooling water over an extended period of time to make each bond. Also there would be a high risk of oxygen entering the joint and making it brittle.

The silver-copper combination advantageously forms a semi-solid, and an associated semi-solid bond, above the temperature at which titanium self-fluxes, but below the Ti-6Al-4V beta transus temperature.

A partially liquid, silver-rich layer can bond to the titanium and SMA components rapidly due to the increased diffusion rates of liquids over solids. If a quantity of the brazing alloy remains solid then the two-phase liquid will have a high viscosity, providing resistance to displacement. Even though a pressure is applied to the parent materials to produce a gas-tight seal, the silver-rich liquid is lost because titanium/copper-rich liquid takes its place, not solely from the pressure itself.

Figure 4:
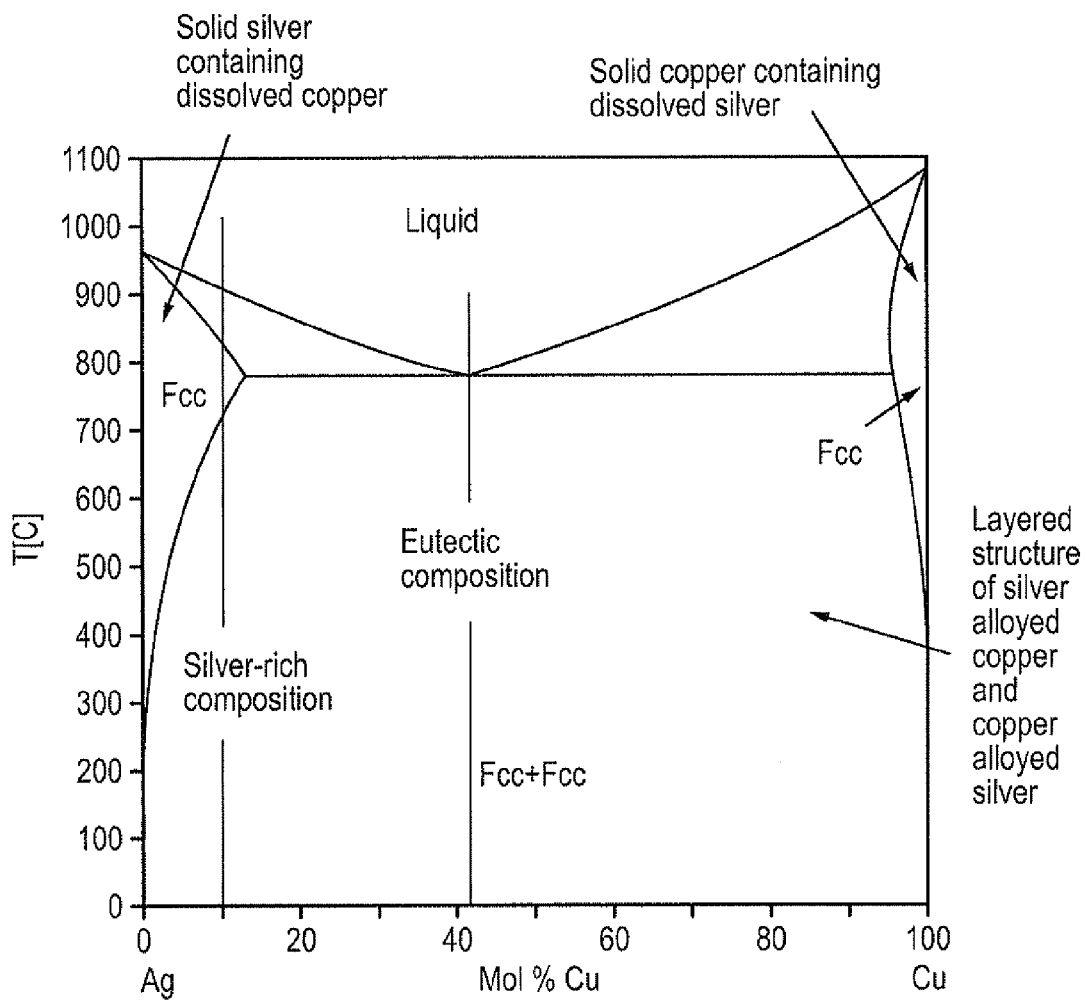

The proportion of solid to liquid in the brazing alloy is a function of the temperature and composition as indicated in FIG. 4. In an initial embodiment, the amount of silver was set at 95% by weight, which is akin to the quantity of silver used in commercially available brazing foils. However it has been found that, by using electroplated silver and copper layers, which become an alloy in situ, it is possible to make use of bespoke foil thicknesses and compositions. Accordingly it has been found that a composition of 12-25% can be used.

Changing the concentration of silver alters the temperature when melting commences (solidus) and the temperature when melting is complete (liquidus). It also has an effect on the affinity of the liquid silver-copper with the titanium or SMA materials.

Copper reacts with titanium more rapidly than silver, which has a two-fold effect. The silver-copper alloy is more effective at wetting the titanium and SMA parent materials when there is a significant amount of copper present, being at least 5% by weight of the alloy. However if too much copper is present then the silver-copper liquid may start to leach titanium out of the parent materials, forming a titanium-copper liquid that can initiate the bridging phenomenon between the parent materials. The correct composition of silver and copper, between the two extremes described above, can produce a fast acting brazing alloy that produces a strong, ductile bond. Through using resistance brazing, this joint can be made without heating the surrounding SMA to a point where they lose their SME properties.

At least one novel aspect of the present invention may be considered to reside in the creation of a brazing alloy in-situ using multiple layers, wherein one such layer is coated onto a component to be bonded. The provision of suitable material layers at the interface between the components to be joined allows for a joining structure that retains sufficient mechanical integrity during brazing such that it still acts as a barrier to diffusion between the parent materials of the components being joined. Welding inevitably forms brittle intermetallics in certain material joining combinations, so a third material interlayer is employed. This interlayer 18 prevents diffusion between the parent materials, whilst bonding them together through partial melting of the electroplated layers. In contrast to conventional brazing, wherein the brazing alloy fully melts, allowing contact of the parent material and therefore intermetallic formation, aspects of this invention allow some of the brazing material to remain solid, physically separating the parent materials, and also partially melts so that a bond can be rapidly made.

The silver layers are at least 20 microns thick to avoid copper interacting with the Titanium alloy as TiCu intermetallic compounds which have lower strength.

Advantages of this method include that the bonding temperature and especially pressure can be reduced to avoid disruption of the parent materials. This is particularly important when joining shape memory alloys to other materials. Also the bond can be achieved in a rapid brazing process which avoids the need for a vacuum.

Returning now to FIG. 2, once the heating step 32 has completed, the completed joint is allowed to cool, either naturally or through forced cooling using conventional techniques.

Figure 1B:
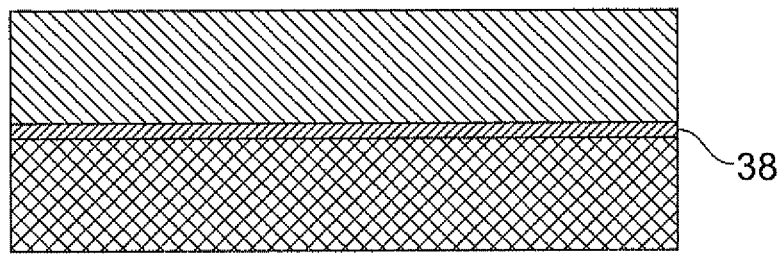
Figure 2:
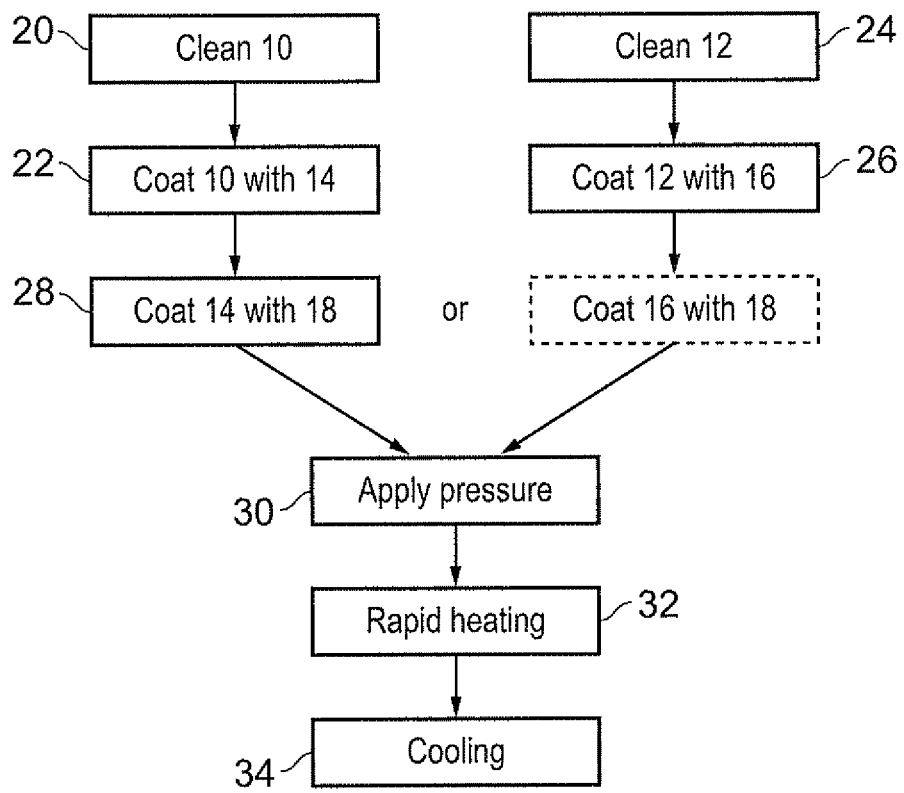
FIG. 2 shows a flow diagram of the steps performed in accordance with one embodiment of the invention.

The final form of the joined components 10 and 12 is shown in FIG. 1b, in which the previous arrangement of layers 14-18 has become a solid solution 38 of the material of layers 14 and 16 (i.e. silver) alloyed with the material of the intermediate layer (i.e. copper). The components 10 and 12 are thus joined by a substantially single layer of alloy 38 so as to provide a bonded article.

One of the driving advantages of the present invention is that it allows a strong metallurgical bond to be formed between SMA and titanium components. However the joining method is also applicable to any metal combination that can be coated with a precious metal such as silver or gold through electrochemical deposition, such as for joining titanium alloys to nickel alloys. It would also be possible to join nickel foams to titanium using this method.

The invention may also be achieved by sputter coating the layers of any or all of brazing materials onto the relevant surfaces, although it is generally felt that this would be a less practical way of coating the surfaces prior to brazing. It will also be appreciated that other coating processes may be attempted for either the coating layers or else the intermediate layer, including other thin film deposition methods, such as physical/chemical vapour deposition, ion beam or dipping the parent metal in a molten bath of the coating metal. Whilst silver is considered the primary choice of precious metal for providing a barrier layer that does not form brittle intermetallics, it could be substituted by other elements that do not form brittle intermetallics, such as gold or platinum.

The melting point depressant selected for this application is copper due to its interaction with silver. However any of a range of other metals could be used, so long as they form a binary eutectic with the precious metal being employed.

This invention is intended to be used with parent metals that are self-fluxing at the intended bonding temperature to produce a fully metallic bond. This differentiates the process from a soldering operation, which would take place at low temperatures and require the use of a separate flux.

Altering the metal combinations used in the manner described above would allow the bonding temperature to be significantly changed. This feature may be of benefit if the parent materials to be bonded are different. Many material combinations form intermetallic phases which are adverse to the formation of a strong bond, and so the present invention could potentially be used for a range of metal combinations that suffer from intermetallic formation during joining, so long as the metals are capable of self-fluxing at the bonding temperature.

In other applications of the invention, the local heating could be applied through other conventional heating techniques, so long as the time at temperature could be accurately controlled.

The invention claimed is:

1. A method of bonding a first component comprising titanium to a second metallic component containing nickel, the method comprising:
    providing the first component comprising titanium, and the second metallic component comprising a nickel-titanium shape memory alloy;
    interposing a plurality of metallic layers between the first component and the second component; and
    heating the plurality of metallic layers so as to form a bond between the first component and the second component by brazing,
    wherein the heating comprises heating the plurality of metallic layers to a temperature at which only a portion of the plurality of metallic layers melts such that at least a remaining portion of the plurality of metallic layers remains solid during the brazing.

2. The method according to claim 1, wherein the interposing of the plurality of metallic layers comprises:
    applying a coating layer to the first component in a region to be bonded; and
    interposing an intermediate layer between the coating layer and the second component.

3. The method according to claim 2, wherein the interposing of the plurality of metallic layers further comprises:
    applying a second coating layer to the second component and interposing the intermediate layer between the coating layer and the second coating layer.

4. The method according to claim 1, wherein one of the plurality of metallic layers serves as a melting point depressant for at least another one of the plurality of metallic layers.

5. The method according to claim 2, wherein the heating of the coating layer and the intermediate layer forms a brazing alloy in situ, the brazing alloy comprising a combination of a material of the coating layer and a material of the intermediate layer.

6. The method according to claim 2, further comprising applying the coating layer and/or the intermediate layer using an electro-deposition process.

7. The method according to claim 2, further comprising applying the intermediate layer to an outer surface of the coating layer of the first component by a coating process.

8. The method according to claim 1, wherein the heating comprises brazing the first component and the second component at or above a temperature at which a material of the first component and a material of the second component are self fluxing.

9. The method according to claim 1, wherein the heating comprises local heating of the first component, the second component, and/or the plurality of metallic layers by resistance heating.

10. The method according to claim 1, wherein the first component comprises a titanium alloy.

11. The method according to claim 1, wherein at least one of the plurality of metallic layers comprises a precious metal, and at least another one of the plurality of metallic layers comprises copper.

12. The method according to claim 1, wherein at least one of the plurality of metallic layers and/or the coating layer has a thickness in the region of 5-30 microns.

13. The method according to claim 1, further comprising:
    holding the first component and the second component together under a pressing force with the plurality of metallic layers disposed there-between so as to apply a pressing force thereto during the heating, the heating being undertaken in an air environment.

14. The method according to claim 1, wherein the interposing of a plurality of metallic layers comprises:
    applying a coating layer to the second component in a region to be bonded; and
    interposing an intermediate layer between the coating layer and the first component.

15. The method according to claim 14, wherein the interposing of a plurality of metallic layers further comprises:
    applying a second coating layer to the first component and interposing the intermediate layer between the coating layer and the second coating layer.

16. The method according to claim 14, wherein the heating of the coating layer and the intermediate layer forms a brazing alloy in situ, the brazing alloy comprising a combination of a material of the coating layer and a material of the intermediate layer.

17. The method according to claim 14, further comprising applying the coating layer and/or the intermediate layer using an electro-deposition process.

18. The method according to claim 14, further comprising applying the intermediate layer to an outer surface of the coating layer of the second component by a coating process.

* * * * *